United States Patent
Kang

(10) Patent No.: US 7,009,865 B2
(45) Date of Patent: Mar. 7, 2006

(54) NON-VOLATILE FERROELECTRIC CELL ARRAY CIRCUIT USING PNPN DIODE CHARACTERISTICS

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 24 days.

(21) Appl. No.: 10/878,312

(22) Filed: Jun. 29, 2004

(65) Prior Publication Data

US 2005/0254283 A1    Nov. 17, 2005

(30) Foreign Application Priority Data

May 17, 2004 (KR) ....................... 10-2004-0034830

(51) Int. Cl.
*G11C 11/22* (2006.01)
(52) U.S. Cl. .................. 365/145; 365/175; 365/230.03
(58) Field of Classification Search ................ 365/145, 365/175, 230.03
See application file for complete search history.

(56) References Cited

U.S. PATENT DOCUMENTS

| | | | | |
|---|---|---|---|---|
| 5,822,240 A | * | 10/1998 | Yoo ........................... | 365/145 |
| 5,926,412 A | * | 7/1999 | Evans et al. ................ | 365/145 |
| 6,151,241 A | * | 11/2000 | Hayashi et al. ............. | 365/145 |
| 6,256,220 B1 | * | 7/2001 | Kamp ......................... | 365/145 |
| 6,859,088 B1 | * | 2/2005 | Toyoda et al. .............. | 327/427 |
| 2003/0174532 A1 | * | 9/2003 | Matsushita et al. ......... | 365/145 |

* cited by examiner

*Primary Examiner*—Hoai Ho
(74) *Attorney, Agent, or Firm*—Heller Ehrman LLP

(57) ABSTRACT

The present invention discloses a non-volatile ferroelectric cell array circuit using PNPN diode characteristics. The non-volatile ferroelectric cell array circuit includes a plurality of top sub cell arrays, a plurality of bottom sub cell arrays, a main bit line sense amp and a word line driving unit. Especially, the top and bottom sub cell arrays have a double bit line sensing structure for inducing a sensing voltage of a main bit line by controlling an amount of a current supplied from a power voltage to the main bit line according to a sensing voltage of a sub bit line receiving a cell data. Each of the sub cell arrays includes a ferroelectric capacitor, and a serial PN diode switch having a PNPN diode and a PN diode, to decrease a cell size and improve operational characteristics of the circuit.

6 Claims, 14 Drawing Sheets

NON-VOLATILE FERROELECTRIC CELL ARRAY CIRCUIT USING PNPN DIODE CHARACTERISTICS

BACKGROUND OF THE INVENTION

1. Field of the Invention

The present invention relates to a non-volatile ferroelectric cell array circuit, and more particular to a non-volatile ferroelectric cell array circuit which can reduce a cell size and improve operational characteristics, by using a double bit line sensing structure for inducing a sensing voltage of a main bit line by using a current gain according to a cell data, and using a PNPN diode as a switch device of a memory cell.

2. Description of the Background Art

A non-volatile ferroelectric memory, namely, a ferroelectric random access memory (FeRAM) has a data processing speed similar to that of a dynamic random access memory (DRAM), and preserves data even in power off. Therefore, the FeRAM is expected as a next generation memory.

The FeRAM has an extremely-similar structure to that of the DRAM, and utilizes high residual polarization which is a property of a ferroelectric by using the ferroelectric as a material of a capacitor. Even when an electric field is removed, data can be preserved by the residual polarization.

Recently, a capacity of the non-volatile ferroelectric memory is increased to a megabyte or gigabyte level. As the capacity of the memory increases, a cell size needs to decrease. However, if the cell size decreases, a cell capacitance also decreases. In order to stably operate the memory, a capacitance of a bit line must be reduced. It is not easy to reduce the capacitance of the bit line in a high integration memory. In addition, an interval between the bit lines is small in the high integration memory. As a result, unnecessary power consumption may be caused by short channels in a cell structure using an NMOS transistor.

SUMMARY OF THE INVENTION

The present invention is achieved to solve the above problems. Accordingly, it is an object of the present invention to decrease a cell size and improve operational characteristics of a non-volatile ferroelectric cell array circuit by improving a structure of the circuit.

In order to achieve the above-described object of the invention, there is provided a non-volatile ferroelectric cell array circuit having PNPN diode characteristics, including: a plurality of top sub cell arrays and a plurality of bottom sub cell arrays having a double bit line sensing structure for inducing a sensing voltage of a main bit line, by controlling an amount of a current supplied from a power voltage to the main bit line according to a sensing voltage of a sub bit line receiving a cell data; a main bit line sense amp disposed between the plurality of top sub cell arrays and the plurality of bottom sub cell arrays, for sensing and amplifying a voltage of a top main bit line shared by the plurality of top sub cell arrays and a voltage of a bottom main bit line shared by the plurality of bottom sub cell arrays according to a sensing signal; and word line drivers for selectively enabling word lines of the sub cell arrays for the read and write operation of the cell data, wherein each of the sub cell arrays includes: a ferroelectric capacitor for storing the cell data, a first electrode of which being coupled to a word line; a PNPN diode coupled between a second electrode of the ferroelectric capacitor and the sub bit line in a backward direction, and turned on when a voltage of the sub bit line is higher than that of the second electrode by a predetermined level; and a PN diode coupled between the second electrode and the sub bit line in the forward direction, and turned on when the voltage of the second electrode is higher than that of the sub bit line by a predetermined level.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A non-volatile ferroelectric cell array circuit having PNPN diode characteristics in accordance with a preferred embodiment of the present invention will now be described in detail with reference to the accompanying drawings.

Figure 1:
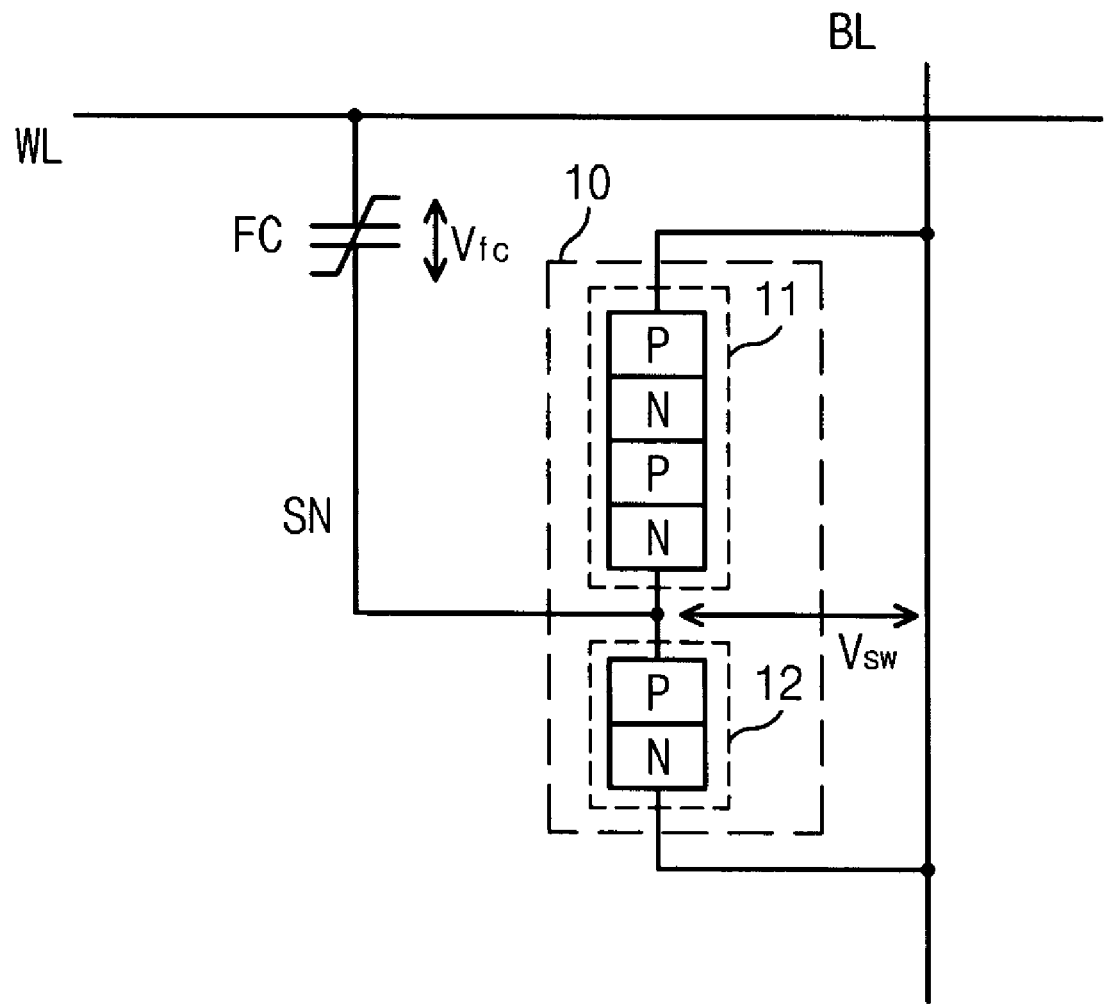
FIG. 1 is a circuit diagram illustrating a PNPN diode cell in accordance with a preferred embodiment of the present invention.

FIG. 1 is a circuit diagram illustrating a PNPN diode cell in accordance with the preferred embodiment of the present invention.

The PNPN diode cell includes one ferroelectric capacitor FC and one serial PN diode switch 10.

One side electrode of the ferroelectric capacitor FC is coupled to a word line WL, and the other side electrode thereof is commonly connected to an N terminal disposed in the end of a PNPN diode 11 and a P terminal of a PN diode 12 in the serial PN diode switch 10.

The serial PN diode switch 10 is turned on/off according to a voltage difference between a bit line BL and the ferroelectric capacitor FC, for switching current flow between the bit line BL and the ferroelectric capacitor FC, by using a serial PN diode chain switch technology. In the serial PN diode switch 10, the PNPN diode 11 and the PN diode 12 are connected in parallel to the bit line BL, and a node SN is formed between the PNPN diode 11 and the PN diode 12. That is, the N terminal disposed in the end of the PNPN diode 11 and the P terminal of the PN diode 12 are commonly connected to the node SN, and a P terminal disposed in the end of the PNPN diode 11 and an N terminal of the PN diode 12 are coupled to the bit line BL. Accordingly, the PNPN diode 11 enables a forward current to flow from the bit line BL to the ferroelectric capacitor FC, and the PN diode 12 enables a forward current to flow from the ferroelectric capacitor FC to the bit line BL.

Figure 2:
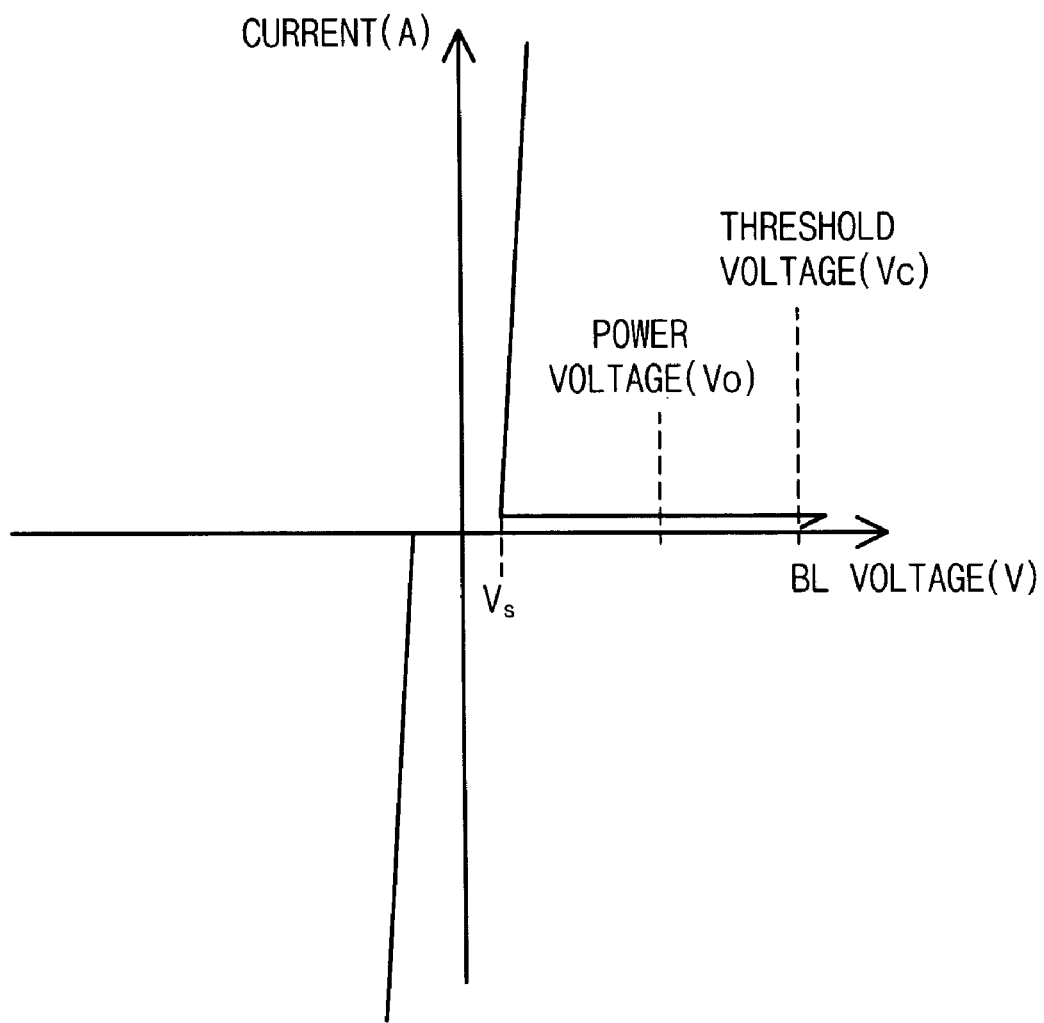
FIG. 2 is a graph showing an operational principle of a serial PN diode switch of FIG. 1.

FIG. 2 is a graph showing an operational principle of the serial PN diode switch 10 of FIG. 1.

In the case that a voltage of the bit line BL increases in a positive direction on the ferroelectric capacitor FC, when the voltage of the bit line BL is a power voltage Vo, the serial PN diode switch 10 maintains an off state according to PNPN diode characteristics. However, when the voltage of the bit line BL is increased to a critical voltage Vc, the PNPN diode 11 is turned on, and thus the current flowing from the bit line BL to the ferroelectric capacitor FC sharply increases. When the voltage of the bit line BL is over the critical voltage Vc, an amount of the current flowing through the PNPN diode 11 is dependent upon a value of a resistor (not shown) coupled to the bit line BL and operated as a load. Once the PNPN diode 11 is turned on, the both end voltage of the serial PN diode switch 10 is decreased to Vs. Here, the PN diode 12 maintains an off state by a reverse voltage.

Conversely, when the voltage of the bit line BL increases in a negative direction on the ferroelectric capacitor FC, namely when a predetermined voltage is applied to the word line WL, the PN diode 12 is turned on by forward operational characteristics, and thus the current flows from the ferroelectric capacitor FC to the bit line BL. Here, the PNPN diode 11 maintains an off state by a reverse voltage.

Figure 3:
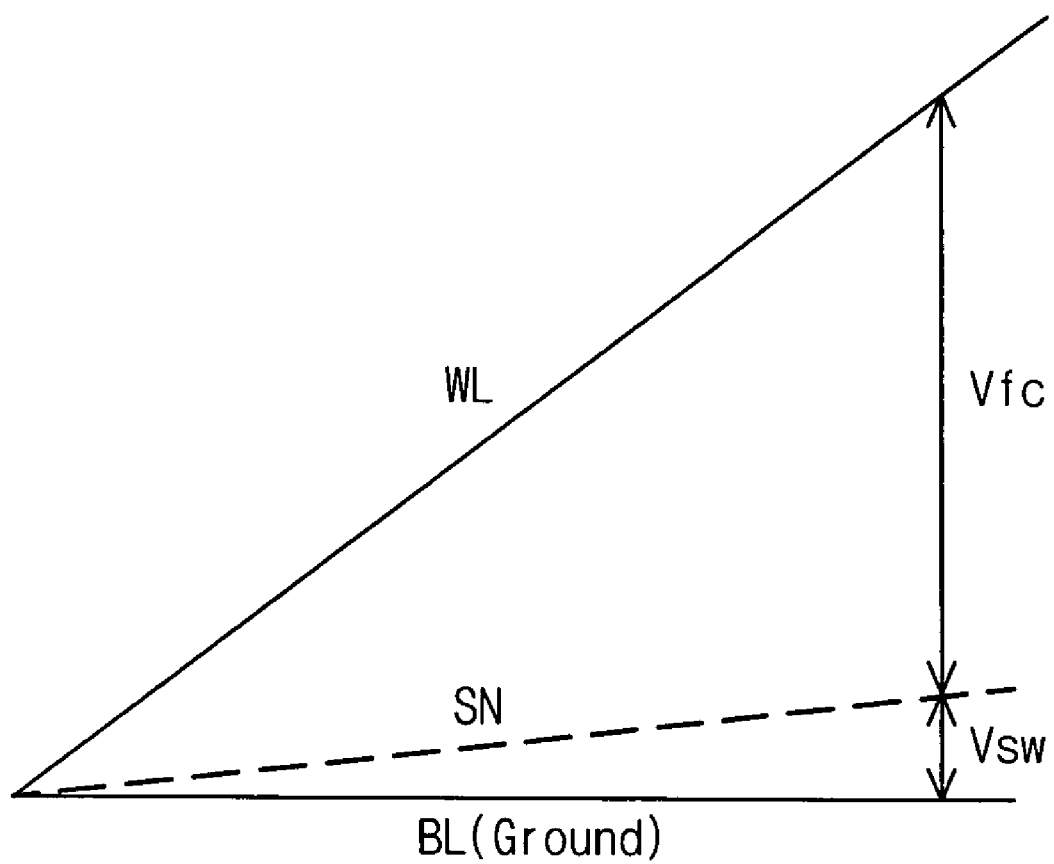
FIG. 3 shows word line voltage dependency of the PNPN diode cell of FIG. 1.

FIG. 3 shows word line voltage dependency of the PNPN diode cell of FIG. 1.

As depicted in FIG. 1, the both end voltage of the ferroelectric capacitor FC is defined as Vfc, and the both end voltage of the serial PN diode switch 10 is defined as Vsw.

In a state where the voltage of the bit line BL is fixed to a ground voltage level, if the voltage of the word line WL increases, the voltage of the word line WL is distributed to the ferroelectric capacitor FC and the serial PN diode switch 10. Here, a small one of the distributed voltage of the word line WL is distributed to the both end voltage Vsw of the serial PN diode switch 10 by the forward operation of the PN diode 12. Conversely, a large one of the distributed voltage of the word line WL is distributed to the both end voltage Vfc of the ferroelectric capacitor FC, to improve operational characteristics of the ferroelectric capacitor FC.

Figure 4:
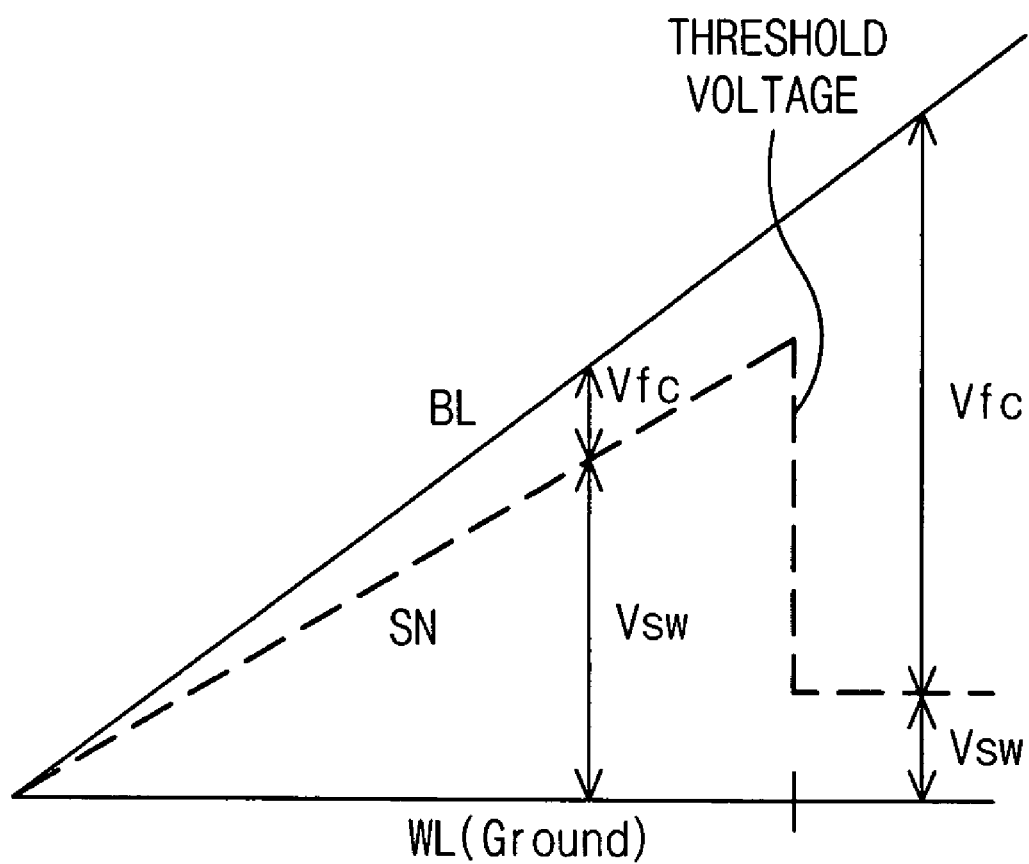
FIG. 4 shows bit line voltage dependency of the PNPN diode cell of FIG. 1.

FIG. 4 shows bit line voltage dependency of the PNPN diode cell of FIG. 1.

In a state where the voltage of the word line WL is fixed to the ground voltage level, if the voltage of the bit line BL increases, the voltage of the bit line BL is distributed to the ferroelectric capacitor FC and the serial PN diode switch 10. Here, a ratio of the voltage distributed to the ferroelectric capacitor FC and the serial PN diode switch 10 is varied according to the critical voltage Vc. That is, until the voltage of the bit line BL reaches the critical voltage Vc, the PNPN diode 11 maintains an off state according to PNPN diode characteristics, and the PN diode 12 maintains an off state by a reverse voltage. Therefore, most of the voltage of the bit line BL is distributed to the both end voltage Vsw of the serial PN diode switch 10. Accordingly, a small one of voltage of the bit line BL is distributed to the both end voltage Vfc of the ferroelectric capacitor FC, and thus the data of the ferroelectric capacitor FC is not changed. However, when the voltage of the bit line BL is over the critical voltage Vc, the PNPN diode 11 of the serial PN diode switch 10 is turned on, and thus most of the voltage of the bit line BL is distributed to the both end voltage Vfc of the ferroelectric capacitor FC. As a result, a new data can be written on the ferroelectric capacitor FC.

Figure 5:
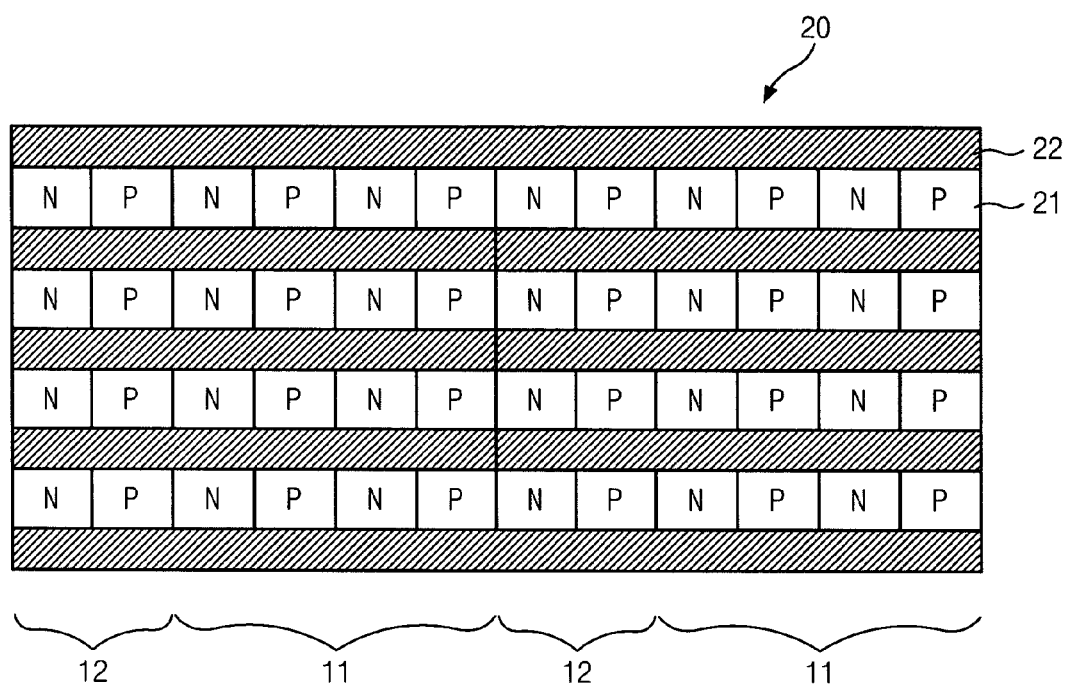
FIG. 5 is a detailed plane diagram illustrating a serial PN diode chain layer in accordance with the preferred embodiment of the present invention.

FIG. 5 is a detailed plane diagram illustrating a serial PN diode chain layer in accordance with the preferred embodiment of the present invention.

In the serial PN diode chain layer 20, a plurality of serial PN diode chains 21 and a plurality of insulation isolation layers 22 are formed on a grown silicon layer or a polysilicon layer. In the serial PN diode chains 21, PN diodes are connected in series in a chain shape. The serial PN diode chains 21 are formed in parallel to each other at predetermined intervals. The insulation isolation layers 22 are formed between the serial PN diode chains 21.

In each serial PN diode chain 21, the PNPN diodes 11 and the PN diodes 12 are consecutively connected in series. In the PNPN diode 11, P type regions and N type regions are alternately connected in series, and in the PN diode 12, a P type region and an N type region are connected in series adjacently to the N region of the PNPN diode 11. The serial PN diode switches 10 of each cell are formed by consecutively selecting one PN diode 12 and one PNPN diode 11 connected in series to the PN diode 12 from the serial PN diode chain 21.

Figure 6:
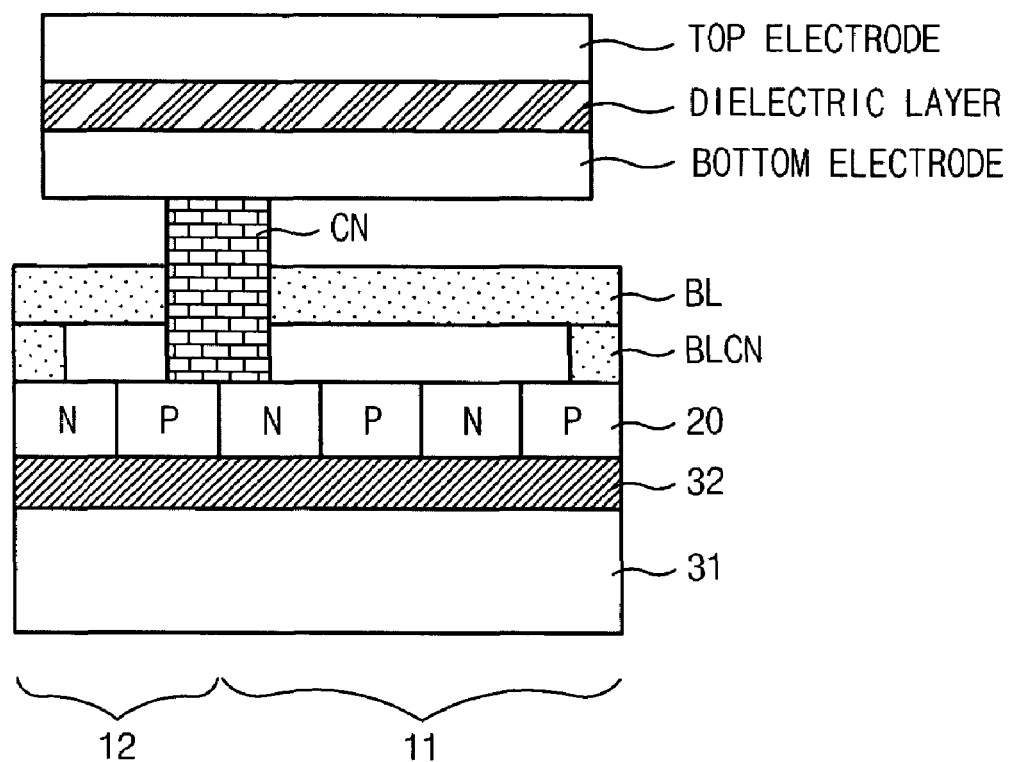
FIG. 6 is a cross-sectional diagram illustrating the PNPN diode cell of FIG. 1.

FIG. 6 is a cross-sectional diagram illustrating the PNPN diode cell of FIG. 1.

An interlayer insulation layer 32 is stacked on the top surface of a silicon substrate 31. The serial PN diode chain layer 20 for forming the serial PN diode switch 10 as shown in FIG. 5 is formed on the top surface of the interlayer insulation layer 32. The serial PN diode chain layer 20 is formed by depositing polysilicon on the top surface of the interlayer insulation layer 32, and forming the serial PN diode chains 21 and the insulation isolation layers 22 on the top surface of the polysilicon.

In the serial PN diode chain 21, the PN diodes 12 and the PNPN diodes 11 are consecutively alternately connected in series. Here, one PN diode 12 and one PNPN diode 11 connected in series to the PN diode 12 compose one serial PN diode switch 10. In the serial PN diode switch 10, bit line contact nodes BLCN are formed on the N terminal of the PN diode 12 and on the end P terminal of the PNPN diode 11, and coupled to the bit line BL. A capacitor contact node CN is formed on the P terminal of the PN diode 12 and the N terminal of the PNPN diode 11 adjacent to the P terminal of the PN diode 12, and coupled to a bottom electrode of the ferroelectric capacitor FC. In the ferroelectric capacitor FC, a ferroelectric film is formed between the top and bottom electrodes. The top electrode of the ferroelectric capacitor FC is coupled to the word line WL.

Figure 7:
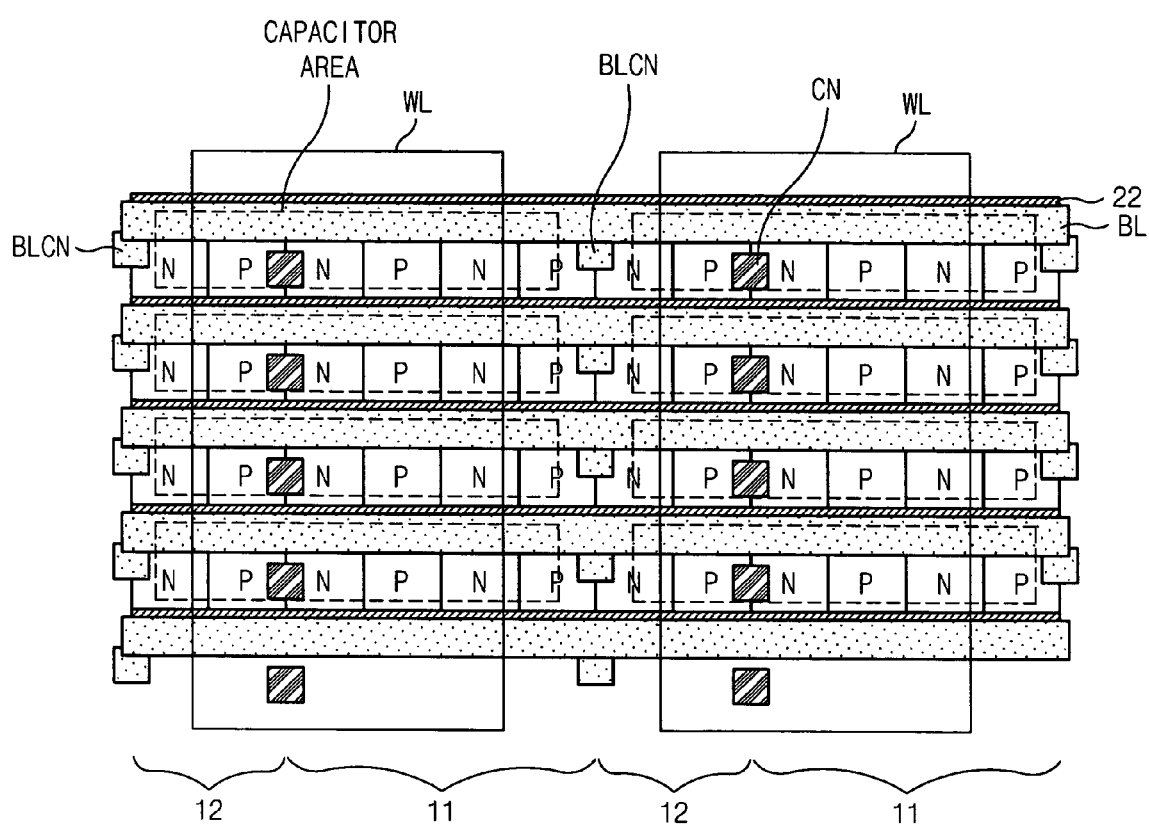
FIG. 7 is a plane diagram illustrating word lines, bit lines and ferroelectric capacitors formed on the serial PN diode chain layer of FIG. 5.

FIG. 7 is a plane diagram illustrating the word lines WL, the bit lines BL and the ferroelectric capacitors FC formed on the serial PN diode chain layer 20 of FIG. 5.

The bit line BL is formed above the contact surface of the serial PN diode chain 21 and the insulation isolation layer 22. The bit line BL is coupled to the N terminal of the PN diode 12 and the end P terminal of the PNPN diode 11 in the corresponding serial PN diode switch 10 through the bit line contact node BLCN.

Here, the bit line contact node BLCN is coupled respectively to the N terminal of the PN diode 12 and the end P terminal of the PNPN diode 11 so that the bit line contact node BLCN may be shared by the adjacent cells. That is, the N terminal of the PN diode 12 of any one cell and the end P terminal of the PNPN diode 11 of the adjacent cell are commonly connected through one bit line contact node BLCN, and coupled to the bit line BL.

The capacitor contact node CN is commonly connected to the P terminal of the PN diode 12 and the end N terminal of the PNPN diode 11 in each serial PN diode chain 21. The word line WL is coupled to the top electrodes of the ferroelectric capacitors FC in the orthogonal direction to the bit line BL.

In accordance with the present invention, a cross point cell including the ferroelectric capacitor FC located where the word line WL and a bit line region (in FIG. 7, the bit line region implies a region including the bit line BL and the serial PN diode chain 21) are crossed is formed. As a result, an additional area for forming a cell is not required.

Figure 8:
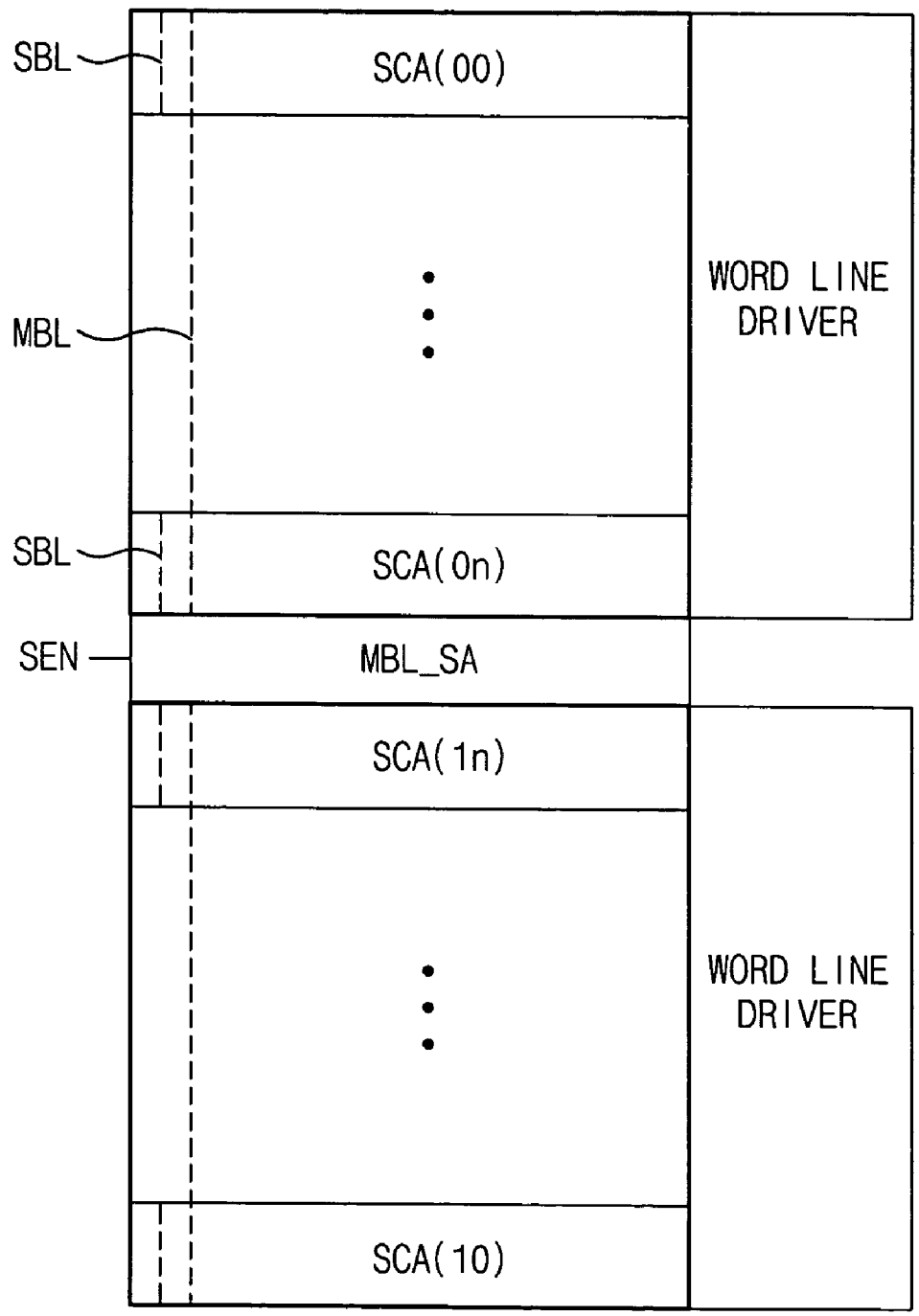
FIG. 8 is a structure diagram illustrating a cell array circuit in accordance with the preferred embodiment of the present invention.

FIG. 8 is a structure diagram illustrating a cell array circuit in accordance with the preferred embodiment of the present invention.

Referring to FIG. 8, the cell array circuit includes a plurality of top sub cell arrays SCA(00) to SCA(0n), a plurality of bottom sub cell arrays SCA(10) to SCA(1n), a main bit line sense amp MBL_SA, and word line driver.

The plurality of top sub cell arrays SCA(00) to SCA(0n) and the plurality of bottom sub cell arrays SCA(10) to SCA(1n) are symmetrical to each other from the main bit line sense amp MBL_SA in the up/down direction. In the sub cell arrays SCA(00) to SCA(0n) and SCA(10) to SCA(1n), ferroelectric memory cells as shown in FIG. 1 are coupled to sub bit lines SBL, for storing data. The sub bit lines SBL are formed in each of the sub cell arrays SCA(00) to SCA(0n) and SCA(10) to SCA(1n). A main bit line MBL is shared by the sub cell arrays SCA(00) to SCA(0n) and SCA(10) to SCA(1n). In each of the sub cell arrays SCA(00) to SCA(0n) and SCA(10) to SCA(1n), the main bit line MBL corresponds to one or plural sub bit lines SBL, so that a sensing voltage of the main bit line MBL can be induced according to a cell data. That is, each of the sub cell arrays SCA(00) to SCA(0n) and SCA(10) to SCA(1n) has a double bit line sensing structure for generating the sensing voltage in the main bit line MBL by controlling an amount of the current applied to the main bit line MBL by a power voltage VCC according to the cell data applied to the sub bit lines SBL.

The main bit line sense amp MBL_SA is shared by main bit lines (top main bit lines) of the top sub cell arrays SCA(00) to SCA(0n) and main bit lines (bottom main bit lines) of the bottom sub cell arrays SCA(10) to SCA(1n) which are symmetrical, for amplifying the sensing voltages induced to the top or bottom main bit lines MBL according to a sensing signal SEN.

The word line drivers control the read/write operation of the cell data by selectively enabling word lines of the top sub cell arrays SCA(00) to SCA(0n) and the bottom sub cell arrays SCA(10) to SCA(1n).

Figure 9:
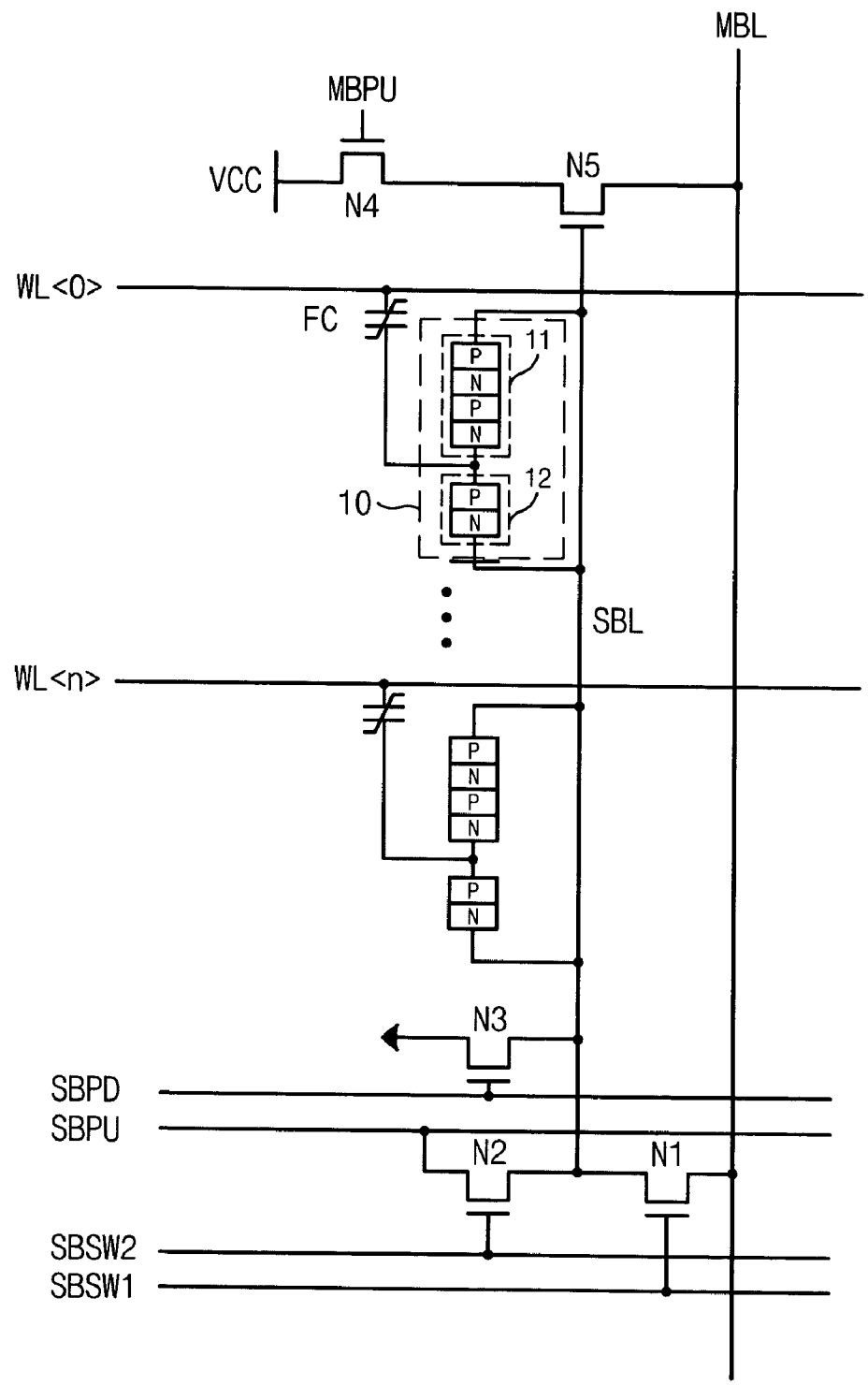
FIG. 9 is a detailed circuit diagram illustrating a first example of one sub cell array of FIG. 8.

FIG. 9 is a detailed circuit diagram illustrating a first example of one sub cell array of FIG. 8.

When a sub bit line select signal SBSW1 is enabled, an NMOS transistor N1 is turned on, and a load of the main bit line MBL is regulated as much as that of one sub bit line SBL. In addition, when a sub bit line pull-down signal SBPD is enabled, an NMOS transistor N3 is turned on, and the sub bit line SBL is pulled down in a ground voltage level.

A sub bit line pull-up signal SBPU controls power supplied to the sub bit line SBL, and a sub bit line select signal SBSW2 controls the sub bit line pull-up signal SBPU to be applied to the sub bit line SBL. For example, in order to generate a high voltage in the sub bit line SBL, a higher voltage than the power voltage VCC is supplied as the sub bit line pull-up signal SBPU, and the sub bit line select signal SBSW2 is enabled. When an NMOS transistor N2 is turned on by the enabled sub bit line select signal SBSW2, the sub bit line pull-up signal SBPU having a high voltage is transmitted to the sub bit line SBL. The cells having the serial PN diode switches 10 are coupled between the sub bit line SBL and word lines WL<0> to WL<n>.

An NMOS transistor N4 is coupled between the power voltage VCC and an NMOS transistor N5, and has its gate connected to receive a main bit line pull-up signal MBPU. The NMOS transistor N5 is coupled between the NMOS transistor N4 and the main bit line MBL, and has its gate connected to the sub bit line SBL. When the main bit line pull-up signal MBPU is enabled, the NMOS transistor N5 controls an amount of the current supplied to the main bit line MBL by the power voltage VCC according to the sensing voltage of the sub bit line SBL. A data induced to the main bit line MBL is determined according to the amount of the current supplied to the main bit line MBL through the NMOS transistor N5. For example, when the cell data has a high level, a high cell voltage is applied to the sub bit line SBL, the amount of the current flowing through the NMOS transistor N5 becomes larger, and thus a high sensing voltage is induced to the main bit line MBL. Conversely, when the cell data has a low level, a low cell voltage is applied to the sub bit line SBL, the amount of the current flowing through the NMOS transistor N5 becomes smaller, and thus a low sensing voltage is induced to the main bit line MBL. That is, the data of the selected cell can be sensed by using a level difference of the sensing voltage induced to the main bit line MBL according to the cell data.

As described above, the voltage level of the sub bit line SBL and the main bit line MBL is maintained in a low level 0V during the precharge operation, by inducing the sensing voltage of the main bit line MBL by using the current gain according to the cell data. Accordingly, the current is not leaked in the precharge period by short channels of the bit lines.

Figure 10:
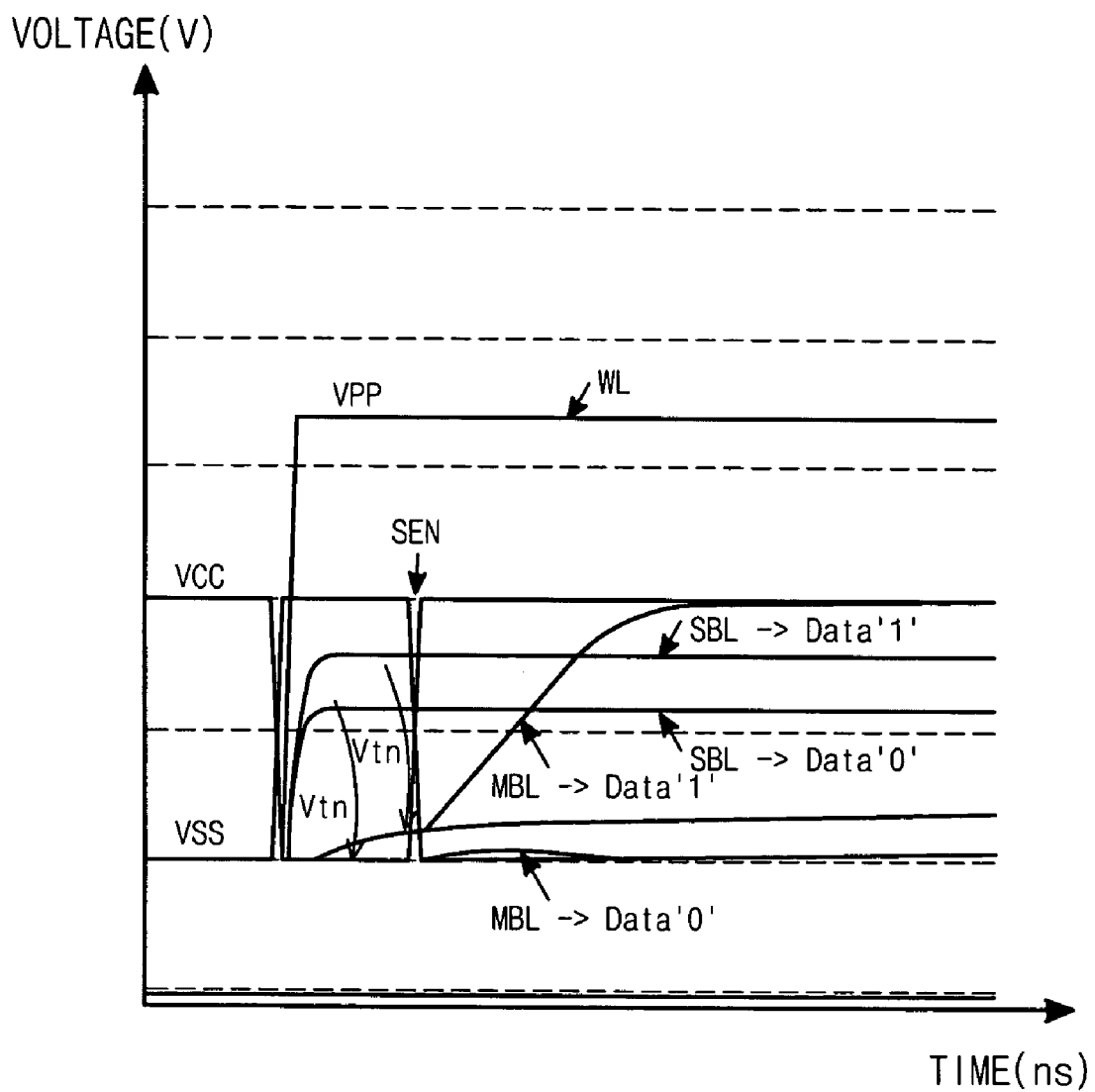
FIG. 10 is a waveform diagram illustrating operational waveforms in the cell array of FIG. 9.

FIG. 10 is a waveform diagram illustrating operational waveforms in the cell array of FIG. 9.

When a signal of the word line WL is enabled in a pumping level VPP, the cell data is transmitted to the sub bit line SBL, to increase the voltage of the sub bit line SBL. The NMOS transistor N5 is turned on by the increased voltage of the sub bit line SBL, and thus the current flows into the main bit line MBL, thereby inducing the sensing voltage to the main bit line MBL. That is, the amount of the current flowing into the main bit line MBL is controlled by the voltage level of the sub bit line SBL, and thus the signal of the sub bit line SBL is transmitted to the main bit line MBL. Here, the voltage level of the main bit line MBL is lower than that of the sub bit line SBL by a threshold voltage Vtn of the NMOS transistor N5. However, the main bit line MBL and the sub bit line SBL have the same voltage phase.

When the sensing signal SEN is enabled, the sensing voltage of the main bit line MBL is amplified by the main bit line sense amp MBL_SA.

Figure 11:
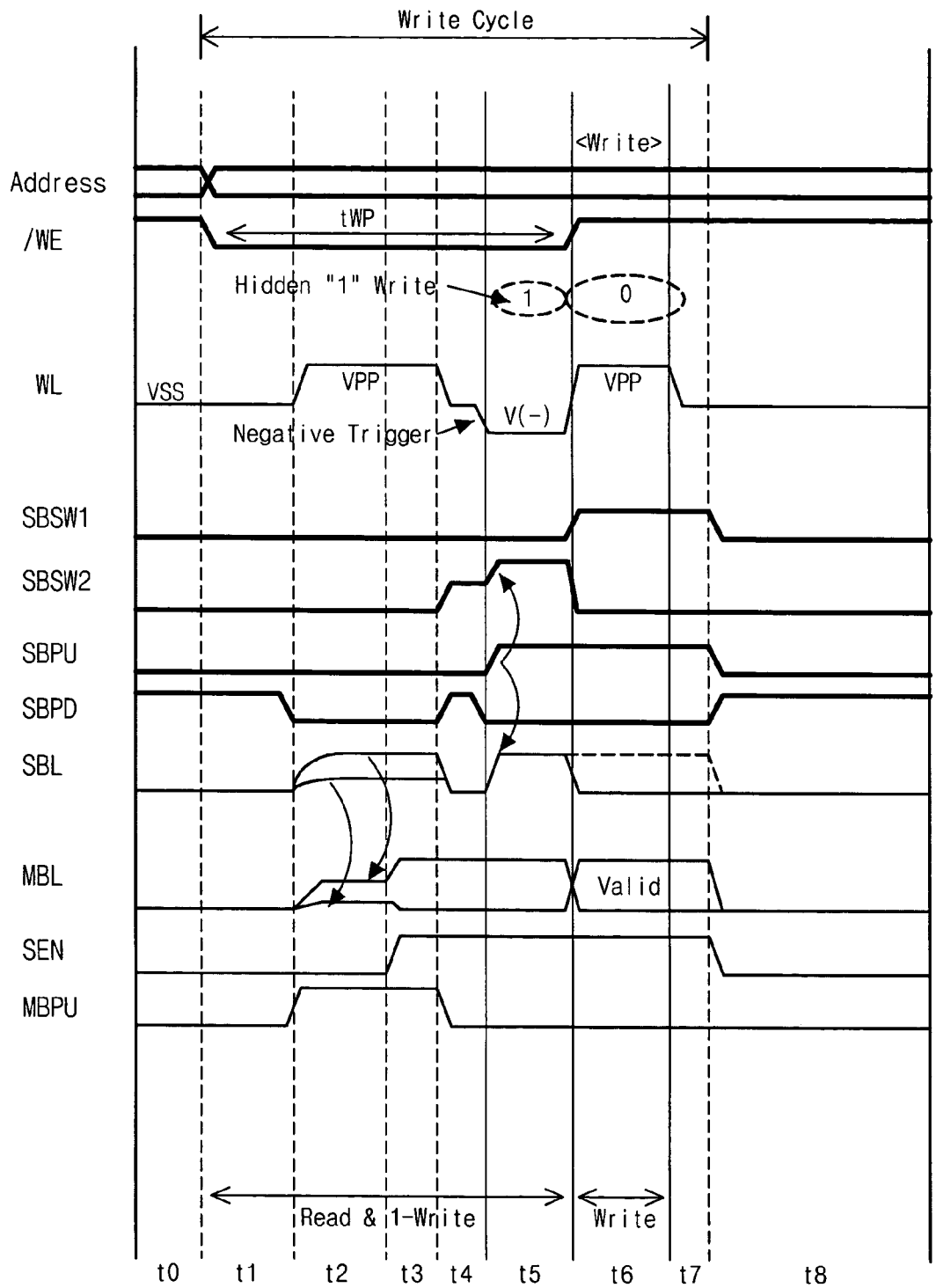
FIG. 11 is a timing diagram showing a write mode operation of the sub cell array of FIG. 9.

FIG. 11 is a timing diagram showing the write mode operation of the sub cell array of FIG. 9.

In t0 and t1 periods, the main bit line MBL and the sub bit line SBL are pulled down to a low level before the word line WL is enabled. In t1 period, when an address is transited and a write enable signal /WE is disabled in a low level, a write mode active state starts. Because the main bit line MBL and the sub bit line SBL are maintained in a low level before the word line WL is enabled, current leakage by the NMOS transistors coupled to the bit lines MBL and SBL or shorts are prevented, to reduce a standby current.

In t2 period, after the sub bit line pull down signal SBPD is transited to a low level, when the word line WL is enabled in a pumping level VPP, the PN diode 12 is turned on, for applying the cell data stored in the ferroelectric capacitor FC to the sub bit line SBL. In a state where the main bit line pull-up signal MPBU is enabled in a high level, when the cell data is applied to the sub bit line SBL, the NMOS transistor N5 is turned on, for supplying the current from the power voltage VCC to the main bit line MBL. Therefore, the sensing voltage is induced to the main bit line MBL.

The word line WL is maintained in a high level till t3 period, and transited to a ground voltage level VSS in t4 period. In t4 period, the sub bit line pull-down signal SBPD is re-enabled, and the sub bit line SBL is pulled down. The sub bit line select signal SBSW2 is enabled in a high level.

In t5 period, after the sub bit line pull-up signal SBPU is enabled in a high level, when the sub bit line select signal SBSW2 is pumped, a high voltage is applied to the sub bit line SBL. The word line WL is transited to a negative voltage V(−). The PNPN diode 11 is turned on by the high voltage of the sub bit line SBL and the negative trigger voltage V(−) of the word line WL, for recording a high level data on the ferroelectric capacitor FC. In t5 period, data 1(Hidden "1") is recorded on the whole cells coupled to the selected word line WL, regardless of an external data. Accordingly, this period is defined as a hidden 1 write period.

In t6 period, when the write enable signal /WE is enabled in a high level, the data write operation is performed. The sub bit line select signal SBSW2 is transited to a low level. In addition, the sub bit line select signal SBSW1 is enabled in a high level, and thus a write data transmitted to the main bit line MBL through a data bus (not shown) is transmitted to the sub bit line SBL and written on the cell. Here, when the data of the sub bit line SBL has a high level, the Hidden data 1 written in t5 period is maintained as it is, and when the data of the sub bit line SBL has a low level, the low level data is written on the corresponding cell. That is, t6 period is a period of writing an external low data 0 on the cell. The word line WL is transited to the pumping level VPP in t6 period, and transited to a low level in t7 period.

Figure 12:
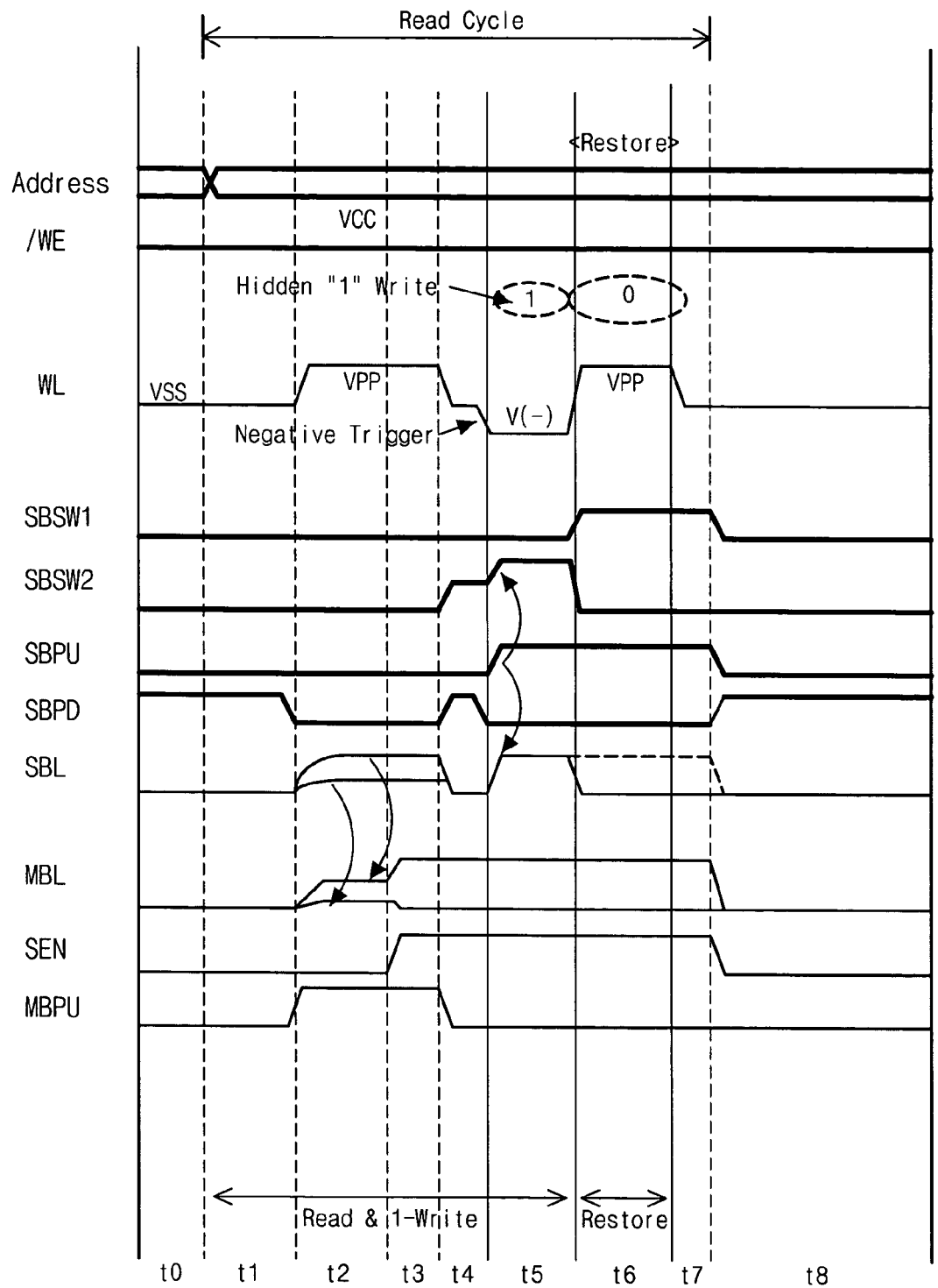
FIG. 12 is a timing diagram showing a read mode operation of the sub cell array of FIG. 9.

FIG. 12 is a timing diagram showing the read mode operation of the sub cell array of FIG. 9.

In the read mode, the write enable signal /WE maintains the power voltage level VCC.

t0 to t5 periods are identical to t0 to t5 periods of FIG. 11. That is, the data of the selected cell is sensed and outputted, and the hidden data 1 is recorded on the selected cell.

In t6 period, when the sub bit line select signal SBSW1 is enabled, a read data induced to the main bit line MBL is transmitted to the sub bit line SBL and restored on the cell. When the data of the sub bit line SBL has a high level, the hidden data written in t5 period is maintained as it is, and when the data of the sub bit line SBL has a low level, the low data is restored on the corresponding cell. Thus, t6 period is a restore period of re-writing the low data 0 which has been internally sensed and amplified on the cell. Here, the main bit line MBL and the sub bit line SBL have the same voltage phase. As in the general hierarchical bit line structure, the voltage of the main bit line MBL is not inverted but transmitted directly to the sub bit line SBL.

Figure 13:
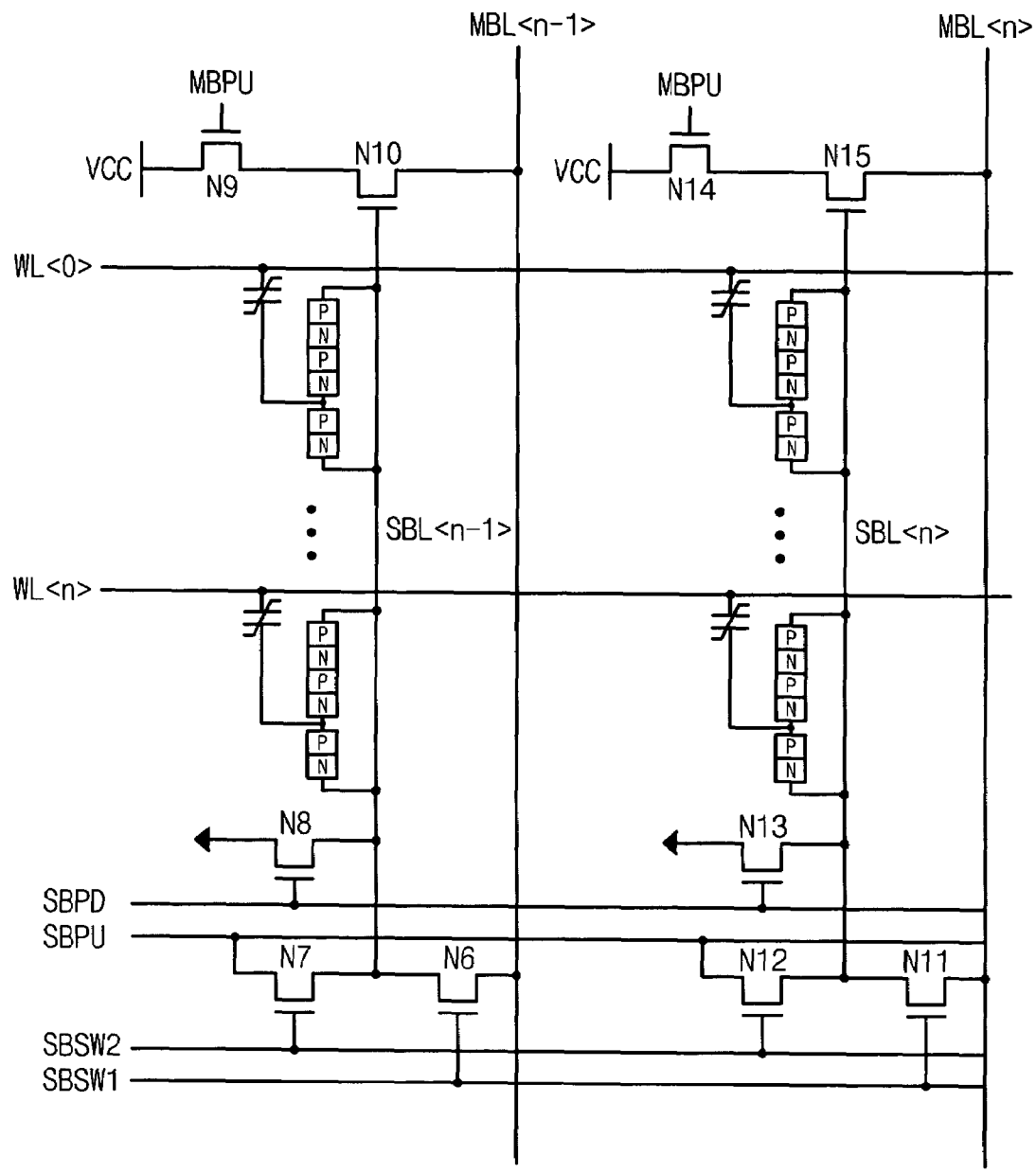
FIG. 13 is a detailed circuit diagram illustrating a second example of one sub cell array of FIG. 8.

FIG. 13 is a detailed circuit diagram illustrating a second example of one sub cell array of FIG. 8.

As illustrated in FIG. 13, in each sub cell array, adjacent sub bit lines SBL<n-1> and SBL<n> are connected in parallel in a double bit line sensing structure to correspond one by one to main bit lines MBL<n-1> and MBL<n>. The operations of the other constitutional elements, N7 to N15 are identical to those of the corresponding constitutional elements of FIG. 9, and thus detailed explanations thereof are omitted.

Figure 14:
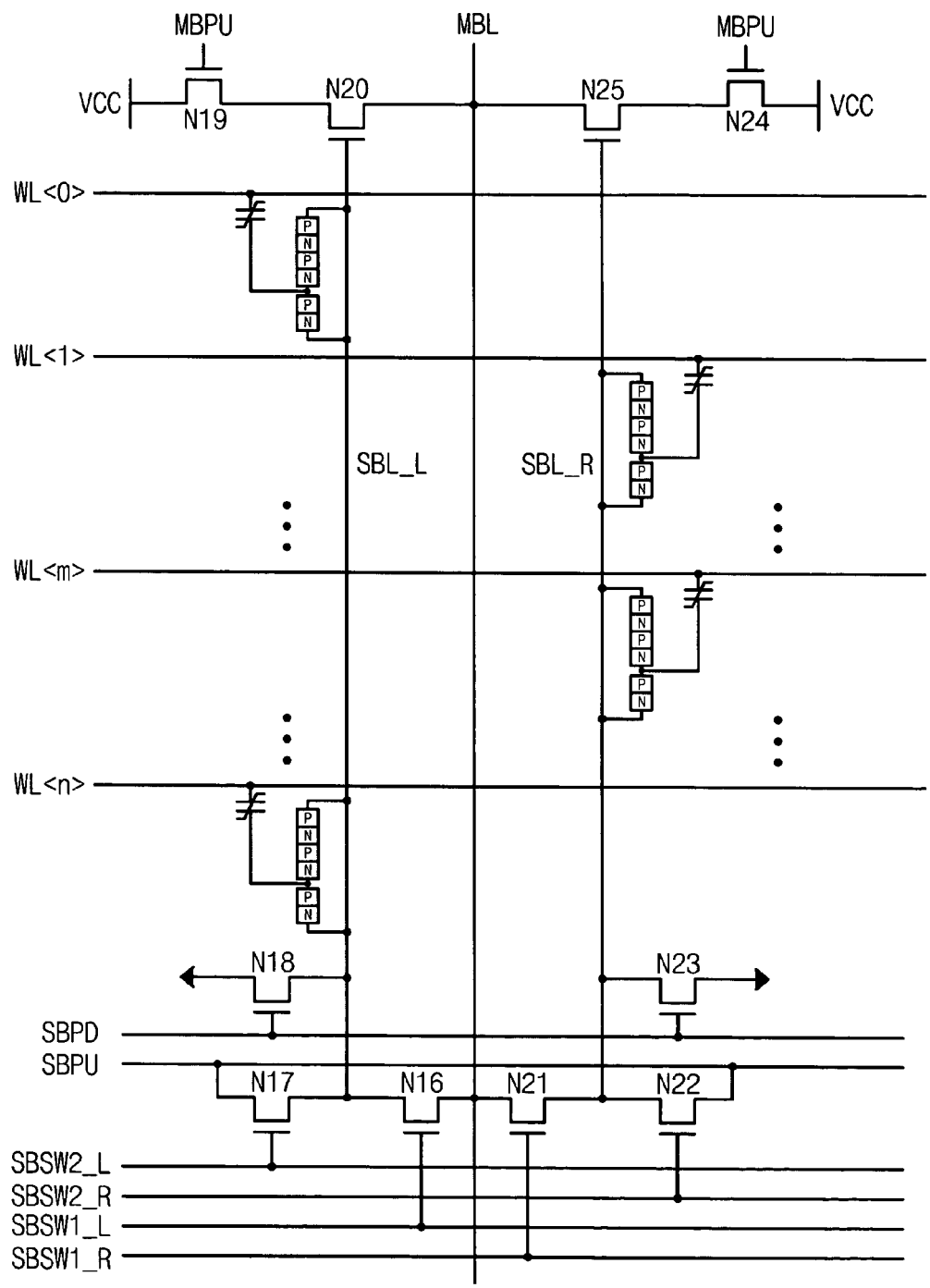
FIG. 14 is a detailed circuit diagram illustrating a third example of one sub cell array of FIG. 8.

FIG. 14 is a detailed circuit diagram illustrating a third example of one sub cell array of FIG. 8.

In each sub cell array, a main bit line MBL is shared by two sub bit lines SBL_L and SBL_R adjacent to the main bit line MBL in left and right sides. In addition, in each sub cell array, cells coupled to the two sub bit lines SBL_L and SBL_R corresponding to one main bit line MBL have a folded bit line structure not to share word lines WL<0> to WL<n>.

When a sub bit line select signal SBSW1_L or SBSW1_R is enabled, an NMOS transistor N16 or N21 is turned on, and thus a load of the main bit line MBL is regulated as much as the sub bit line SBL_L or SBL_R. When the sub bit line pull-down signal SBPD is enabled, NMOS transistors N18 and N23 are turned on, and thus the sub bit lines SBL_L and SBL_R are pulled down to a ground voltage level. A sub bit line pull-up signal SBPU controls power supplied to the sub bit lines SBL_L and SBL_R. Sub bit line select signals SBSW2_L and SBSW2_R control signal flow between the sub bit line pull-up signal SBPU line and the sub bit lines SBL_L and SBL_R, by selectively turning on/off NMOS transistors N17 and N22.

In accordance with the present invention, the two sub bit lines SBL_L and SBL_R share one main bit line MBL, and thus are distinguished and controlled by using different sub bit line select signals SBSW1_L, SBSW1_R, SBSW2_L and SBSW2_R.

NMOS transistors N19 and N24 are coupled between a power voltage VCC and NMOS transistors N20 and N25, and have their gates connected to receive a main bit line pull-up signal MBPU. The NMOS transistors N20 and N25 are coupled between the NMOS transistors N19 and N24 and the main bit line MBL, and have their gates connected to the sub bit lines SBL_L and SBL_R. When the main bit line pull-up signal MBPU is enabled, the NMOS transistors N20 and N25 induce a sensing voltage of the main bit line MBL by controlling an amount of the current supplied to the main bit line MBL by the power voltage VCC according to the sensing voltage of the sub bit lines SBL_L and SBL_R.

As discussed earlier, in accordance with the present invention, the non-volatile ferroelectric cell array circuit having the PNPN chain structure remarkably reduces the cell size by using the PNPN diode as the switch device of the cell. Moreover, the non-volatile ferroelectric cell array circuit having the PNPN chain structure includes the double bit line sensing structure for inducing the sensing voltage of the main bit line by using the current gain according to the cell data, and allows the plurality of sub bit lines to commonly correspond to one main bit line, thereby improving the operational characteristics of the cell and solving the short channel problems.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A non-volatile ferroelectric cell array circuit, comprising:
   a plurality of top sub cell arrays and a plurality of bottom sub cell arrays having a plurality of main bit lines and a plurality of sub bit lines by controlling an amount of a current supplied from a power voltage to the main bit line according to a sensing voltage of the sub bit line receiving a cell data;
   a main bit line sense amplifier disposed between the plurality of top sub cell arrays and the plurality of bottom sub cell arrays, for sensing and amplifying the sensing voltage of a top main bit line shared by the plurality of top sub cell arrays and the sensing voltage of a bottom main bit line shared by the plurality of bottom sub cell arrays according to a sensing signal; and
   word line drivers for selectively enabling word lines of the sub cell arrays for the read and write operation of the cell data,
   wherein each of the sub cell arrays comprises:
   a ferroelectric capacitor for storing the cell data, a first electrode of which being coupled to a word line;
   a PNPN diode coupled between a second electrode of the ferroelectric capacitor and the sub bit line in a backward direction, and turned on when a voltage of the sub bit line is higher than that of the second electrode by a predetermined level; and
   a PN diode coupled between the second electrode and the sub bit line in the forward direction, and turned on when the voltage of the second electrode is higher than that of the sub bit line by a predetermined level.

2. The circuit of claim 1, wherein the main bit line and the sub bit line maintain a ground voltage state before the word line is enabled, for reading or writing the cell data.

3. The circuit of claim 1, wherein a plurality of sub bit lines adjacent to one main bit line in left and right sides commonly correspond to the main bit line.

4. The circuit of claim 3, wherein the main bit line and the sub bit line maintain a ground voltage state before the word line is enabled, for reading or writing the cell data.

5. The circuit of claim 3, wherein each of the sub cell arrays has a folded bit line structure where a plurality of cells coupled to the plurality of sub bit lines adjacent to the main bit line do not share the word line.

6. The circuit of claim 1, wherein the PNPN diode and the PN diode are connected in series in a chain shape so that a end N terminal of the PNPN diode can contact a P terminal of the PN diode, and the end N terminal of the PNPN diode and the P terminal of the PN diode are commonly connected to the second electrode through the same contact node.

* * * * *